(12) United States Patent
Bartscher et al.

(10) Patent No.: US 12,267,944 B2
(45) Date of Patent: Apr. 1, 2025

(54) SUPPORT ASSEMBLY, UNIT, AND LIGHT MODULE FOR A MOTOR VEHICLE LIGHTING DEVICE, AND METHOD FOR MANUFACTURING A UNIT

(71) Applicant: HELLA GmbH & Co. KGaA, Lippstadt (DE)

(72) Inventors: Sebastian Bartscher, Hamm (DE); Fabian Evers, Delbrueck (DE); Heinz-Peter Kleeschulte, Anroechte (DE); Werner Koesters, Coesfeld-Lette (DE); Michael Lakenbrink, Oelde (DE); Konrad Schuerhoff, Rietberg (DE); Thomas Wiese, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 18/656,536

(22) Filed: May 6, 2024

(65) Prior Publication Data
US 2024/0373542 A1 Nov. 7, 2024

(51) Int. Cl.
*H05K 1/02* (2006.01)
*F21S 41/141* (2018.01)
*F21S 45/47* (2018.01)
*F21Y 115/10* (2016.01)

(52) U.S. Cl.
CPC .......... *H05K 1/0204* (2013.01); *F21S 41/141* (2018.01); *F21S 45/47* (2018.01); *F21Y 2115/10* (2016.08); *H05K 2201/066* (2013.01); *H05K 2201/09036* (2013.01)

(58) Field of Classification Search
CPC ....... H05K 1/0204; F21S 41/141; F21S 45/47
See application file for complete search history.

(56) References Cited

U.S. PATENT DOCUMENTS

| | | | | |
|---|---|---|---|---|
| 6,045,240 A | * | 4/2000 | Hochstein | G08G 1/095 362/373 |
| 2009/0103295 A1 | * | 4/2009 | Wang | F21S 41/151 362/249.02 |
| 2010/0177519 A1 | * | 7/2010 | Schlitz | F21V 29/70 417/48 |
| 2010/0276711 A1 | * | 11/2010 | Hand | H05K 3/284 257/E33.056 |
| 2015/0126026 A1 | * | 5/2015 | Sachs | H05K 1/0271 438/598 |
| 2015/0173227 A1 | * | 6/2015 | Ott | H05K 5/065 29/829 |
| 2022/0032515 A1 | * | 2/2022 | Brinkmeier | F21S 41/29 |

FOREIGN PATENT DOCUMENTS

| | | |
|---|---|---|
| DE | 102013208605 A1 | 11/2014 |
| DE | 102019111591 A1 | 11/2020 |
| DE | 102022111490 A1 | 11/2023 |

\* cited by examiner

*Primary Examiner* — Christopher E Dunay
(74) *Attorney, Agent, or Firm* — Muncy, Geissler, Olds & Lowe, P.C.

(57) ABSTRACT

The present invention relates to a support assembly for an electronic component, at least including a metallic heat sink, and a plastic element with a receiving section for accommodating the electronic component. The plastic element is connected to the heat sink in a form-fit manner. The receiving section of the plastic element covers a heat input side of the heat sink. The plastic element includes a thermosetting plastic with fillers for increasing the thermal conductivity.

14 Claims, 3 Drawing Sheets

SUPPORT ASSEMBLY, UNIT, AND LIGHT MODULE FOR A MOTOR VEHICLE LIGHTING DEVICE, AND METHOD FOR MANUFACTURING A UNIT

This nonprovisional application claims priority under 35 U.S.C. § 119 (a) to German Patent Application No. 10 2023 111 603.7, which was filed in Germany on May 4, 2024, and which is herein incorporated by reference.

BACKGROUND OF THE INVENTION

Field of the Invention

The present invention relates to a support assembly for an electronic component, in particular for a component with light-emitting diodes, a unit made up of the support assembly and the electronic component, and a light module, based thereon, for a motor vehicle lighting device. The invention further relates to a method for manufacturing the unit.

Description of the Background Art

For electronic components with high-performance electrical consumers, efficient dissipation of the operating heat must be ensured. For example, heat management is an important criterion in designing motor vehicle lighting devices, in particular headlights, in addition it being necessary to take into account numerous technical constraints such as the available installation space. In present motor vehicle lighting devices, the illuminants are generally formed by light-emitting diodes, which as electronic parts are situated on a circuit board. Different approaches are known in the prior art for enabling the circuit boards, as support elements that are functionally electrically insulating and thus designed with poor thermal conductivity, to efficiently dissipate heat, for example by means of inlaid metal cores. The circuit boards on the rear side are typically situated on a metallic heat sink, and the joint gap between the rear side of the circuit board and the heat input side of the heat sink is filled with a medium having good thermal conductivity, such as thermally conductive paste, solder, or a suitable adhesive.

SUMMARY OF THE INVENTION

It is therefore an object of the present invention to provide a support assembly for an electronic component, in particular for a component with light-emitting diodes, and a unit made up of the support assembly and the electronic component, which in particular have a compact design and ensure efficient dissipation of operating heat.

In an example, of the invention a support assembly is provided for an electronic component, at least including a metallic heat sink and a plastic element with a receiving section for accommodating the electronic component, wherein the plastic element is connected to the heat sink in a form-fit manner, the receiving section of the plastic element covers a heat input side of the heat sink, and the plastic element includes a thermosetting plastic with fillers for increasing the thermal conductivity.

A basic concept of the invention is that, proceeding from a conventional metallic heat sink, the connection to the component to be cooled is established using an element that includes a thermosetting plastic with good thermal conductivity, which as a component that is molded on by means of injection molding, for example, has full-surface contact, free of joining gaps, with the heat input side of the heat sink. The discharge of the operating heat into the heat sink takes place directly from the plastic element into the heat input side, since no other intermediate media, such as thermally conductive pastes, are involved. The increased thermal conductivity of the thermosetting plastic is based on functional fillers, in particular in the form of metallic microparticles, the degree of filling being such that the formed plastic element macroscopically represents an electrical insulator. It is thus possible in particular to provide am electrical strip conductor system and the electronic parts directly on the exposed top side of the receiving section of the plastic element, and thus dispense with a separate circuit board. The receiving section of the plastic element extends essentially between an electronic component, to be situated on the top side, and the heat input side of the heat sink.

The configuration of the heat sink can be adapted to the particular intended use of the support assembly; for example, the heat input side extends essentially planarly (apart from any microstructures), and on an opposite side the heat sink has protruding cooling ribs for releasing heat to the surroundings. In principle, the heat sink may have an individual free form, wherein the plastic element molded on in particular by injection molding opens up further design options. The heat sink may, for example, have advantageous boreholes, blind holes, protrusions, or the like for establishing the form-fit connection.

The fillers can have a globular shape, for example, and in particular are made of metal or a ceramic material such as aluminum nitride or silicon carbide. The fillers are embedded in a thermosetting matrix material, for example an epoxy resin or polyurethane. A plastic element that is integrated into the support assembly according to the invention preferably has an electrical insulation resistance of at least $10^7 \Omega$ and/or a preferably isotropic thermal conductivity of at least 1 W/mK, preferably at least 10 W/mK, in each case at room temperature. If the plastic element in the intended use of the support assembly according to the invention is to fulfill an additional retaining function (see below), in addition a fiber reinforcement of the thermosetting plastic with glass fibers or carbon fibers, for example, may be present.

The heat input side of the heat sink can have a microstructured surface, in particular with undercut microstructures, and the receiving section of the plastic element is thus connected in a form-fit manner. The microstructures are enclosed or penetrated by the plastic element in a form-fit manner, as a result of which the contact surface between the plastic element and the heat input side of the heat sink is enlarged compared to a strictly planar boundary surface, resulting in particularly effective heat transfer. In the embodiment with undercut microstructures, a form-fit connection to the plastic element is formed in the transverse direction. In principle, the microstructures on the heat input side may have any advantageous shape, for example a grooved, trenched, rod-like, or comb-like shape, or may be designed as irregular cavities and/or asperities.

For example, the receiving section of the plastic element forms a cover for the heat input side of the heat sink, having a thickness in the range of 0.1 millimeter to 1 millimeter. As a result, the transversal heat diffusion path between an electronic component to be cooled, on the top side of the receiving section and the heat sink, is extremely small, so that rapid cooling is made possible during operation.

The plastic element has a retaining section that is designed for external attachment of the support assembly. For example, the retaining section forms a protruding support arm by means of which the support assembly together with an electronic component accommodated thereon may be attached in a higher-level unit such as a headlight. In particular, the thermosetting plastic contained in the plastic element has fiber reinforcement for improving the suitability as a retaining structure.

A first unit according to the invention can include at least one support assembly according to one of the above-mentioned examples and an electronic component, the electronic component including at least one electronic part, in particular a light-emitting diode, and a strip conductor system for electrically contacting the electronic part, the electronic part and the strip conductor system being situated on the receiving section of the plastic element. In this example, the electronic component has a design that is free of a separate circuit board, and instead the receiving section of the plastic element forms the substrate for the electronic component.

The unit according to the invention can include at least one support assembly according to one of the above-mentioned examples and an electronic component, the electronic component including at least one electronic part, in particular a light-emitting diode, and a circuit board with a strip conductor system for electrically contacting the electronic part, the electronic part being situated on the circuit board, and the circuit board being connected to the plastic element in a form-fit manner. In this example, a conventional circuit board is accommodated at the support assembly, and for this purpose, in the area of the receiving section is embedded in the plastic element above the heat input side of the heat sink. The circuit board may be designed as a so-called insulated metal substrate (IMS), for example, and may include a metal plate and an insulating layer, the insulating layer electrically insulating the strip conductor system from the metal plate. The rear side of the circuit board advantageously has a microstructured surface, in particular with undercut microstructures, and the receiving section of the plastic element is thus connected in a form-fit manner. With regard to the advantages and examples of such microstructures, reference is analogously made to the above statements concerning the microstructured heat input side of the heat sink.

The invention further relates to a light module for a motor vehicle lighting device, including a unit according to one of the above-mentioned examples, the at least one electronic part being designed as a light-emitting diode. In particular, the light module is provided for a headlight and includes a plurality of light-emitting diodes configured in a matrix, for example. The retaining section of the plastic element may be used to assign the light module to a support frame of the lighting device.

The invention further relates to a method for manufacturing a unit corresponding to the first example mentioned above, at least comprising the following method steps: providing the metallic heat sink, in particular the heat input side of the heat sink being provided with a microstructured surface, in particular with undercut microstructures, injection molding or hot pressing of a compound containing a thermosetting plastic with fillers for increasing the thermal conductivity, with formation of the plastic element in a form-fit connection to the heat sink, the heat input side of the heat sink being covered by the receiving section of the plastic element, applying the strip conductor system to a receiving section of the plastic element, in particular by use of an MID process, and applying the at least one electronic part to the receiving section of the plastic part to establish electrical contacting via the strip conductor system.

The microstructuring of the heat input side may have been carried out in advance using any advantageous process, for example laser structuring, chemical etching, or machining. In injection molding or hot pressing, by use of the thermosetting plastic compound the plastic element is molded onto the heat sink, establishing a form-fit connection between the microstructured surface of the heat input side and the receiving section of the plastic element, and optionally even further form-fit connections between the heat sink and the plastic element. Manufacture of the plastic element by hot pressing is particularly suited for fiber-reinforced compounds based on a sheet molding compound (SMC).

The receiving section of the plastic element functions as a substrate for the electronic component. The associated metallic strip conductor system is applied, for example, using a method from the group of manufacturing processes for so-called molded interconnect devices (MIDs), for example by means of lithographic processes, laser structuring, or direct conductor scribing.

For manufacturing a unit corresponding to the second example mentioned above, the invention discloses a further method which at least comprises the following method steps: providing the metallic heat sink, in particular the heat input side of the heat sink being provided with a microstructured surface, in particular with undercut microstructures, providing the circuit board together with the strip conductor system, in particular the rear side of the circuit board being provided with a microstructured surface, in particular with undercut microstructures, injection molding a compound containing a thermosetting plastic with fillers for increasing the thermal conductivity, with formation of the plastic element in a form-fit connection to the heat sink and to the circuit board, the heat input side of the heat sink and the rear side of the circuit board being covered by the receiving section of the plastic element, and applying the at least one electronic part to the circuit board to establish electrical contacting via the strip conductor system.

In this method, a pre-assembled circuit board is provided as a substrate for the at least one electronic part, and together with the heat sink is arranged in the injection mold and extrusion-coated to establish a form-fit connection to the plastic element.

For example, to establish a form-fit connection to the plastic element the heat sink can be provided with advantageous boreholes, blind holes, protrusions, or the like, which are penetrated or enclosed during injection molding or hot pressing of the plastic compound. The characteristic dimensions are in particular significantly larger than for the undercut microstructures on the heat input side of the heat sink.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

Further measures enhancing the invention are explained in greater detail below, together with the description of preferred exemplary embodiments of the invention and the figures. The figures show the following, in each case in a schematic cross-sectional view:

FIG. 4b shows a detailed view of FIG. 4a.

DETAILED DESCRIPTION

Figure 1A:
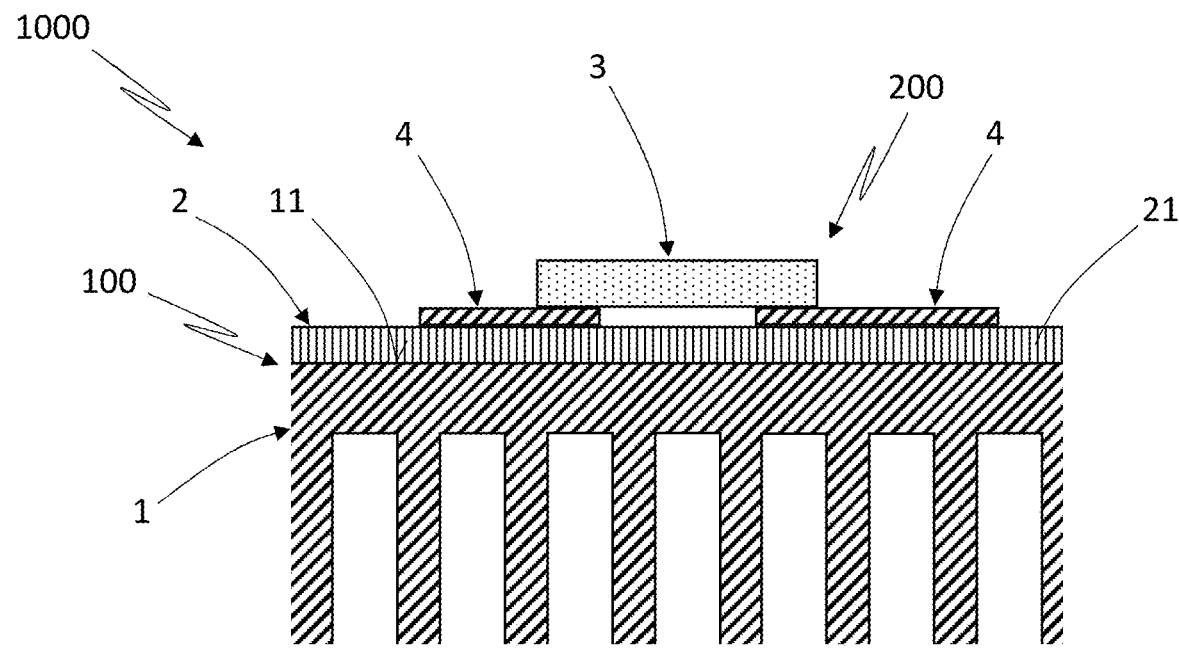
FIG. 1a shows an example of a unit according to the invention.

FIG. 1a shows a detail of a first example of a unit 1000 according to the invention, including the support assembly 100 and the electronic component 200, wherein the electronic component 200 includes the electronic part 3, for example in the form of a light-emitting diode, and the strip conductor system 4 for electrically contacting the electronic part 3, the electronic part 3 and the strip conductor system 4 being situated on the receiving section 21 of the plastic element 2. In addition to the plastic element 2, the support assembly 100 includes the metallic heat sink 1, which is thus connected in a form-fit manner.

Figure 1B:
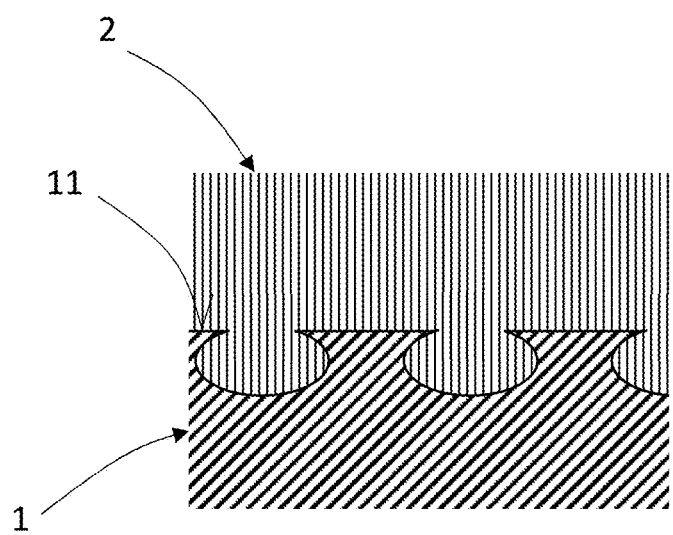
FIG. 1b shows a detailed view of FIG. 1a,
FIG. 2 shows an example.

As shown in the detailed view of FIG. 1b, the form-fit connection is formed in the contact zone between the heat input side 11 of the heat sink 1 and the plastic element 2. For this purpose, the heat input side 11 has a microstructured surface with undercut microstructures, which by way of example are formed here in the form of bulging cavities, and the form-fit connection is established by the enclosure of the microstructures, or the penetration into the cavities, by the plastic element 2.

The electronic component 200 has a design that is free of a conventional circuit board, and instead the receiving section 21 of the plastic element 2 functions as a substrate, on the top side of which the strip conductor system 4 and the electronic part 3 are situated.

Figure 2:
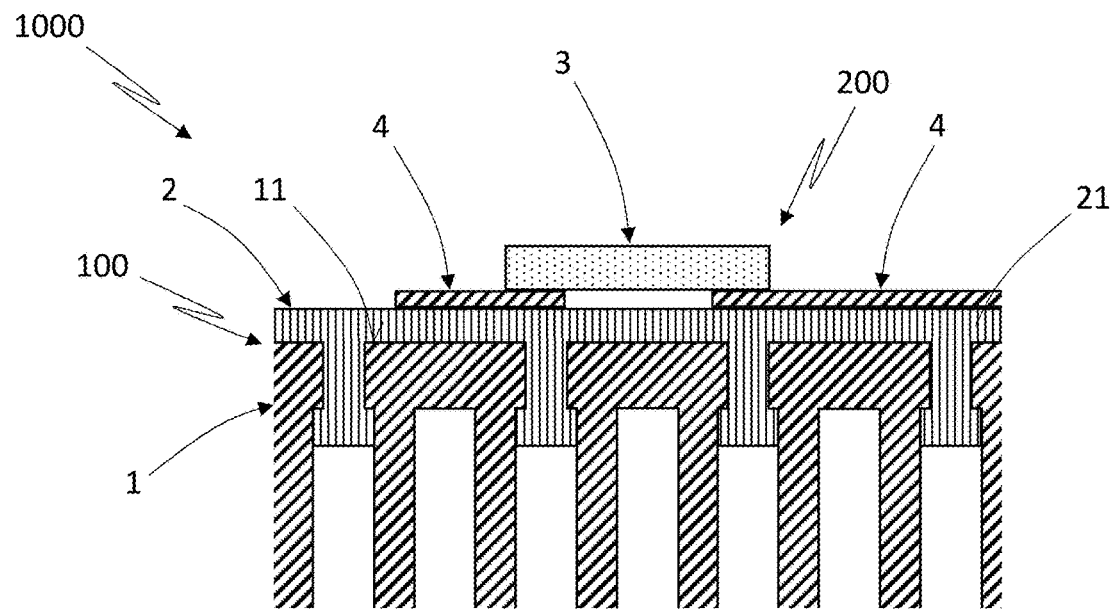

FIG. 2 shows a detail of a second example of a unit 1000 according to the invention, which differs from the first example by the presence of larger form-fit connection zones between the plastic element 2 and the heat sink 1. The heat sink 1 has boreholes between the heat input side 11 and the spaces between the cooling ribs, through which the plastic element 2 is passed in the course of manufacturing, in particular by injection molding. These more robust form-fit connections may be present combined with micro-form fittings across a microstructured heat input side 11 (see FIG. 1b).

Figure 3:
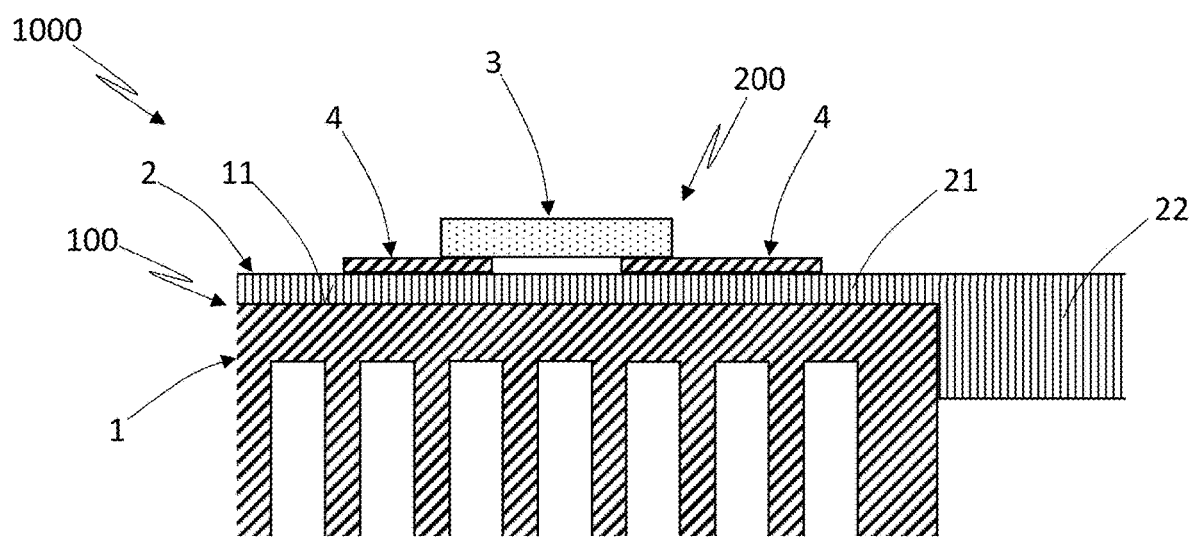
FIG. 3 shows an example.

FIG. 3 shows a detail of a third example of a unit 1000 according to the invention, whose support assembly 100 includes a plastic element 2 with a retaining section 22. In the present case, the retaining section protrudes laterally from the heat sink 1 by way of example, and is provided for external attachment of the unit 1000.

Figure 4A:
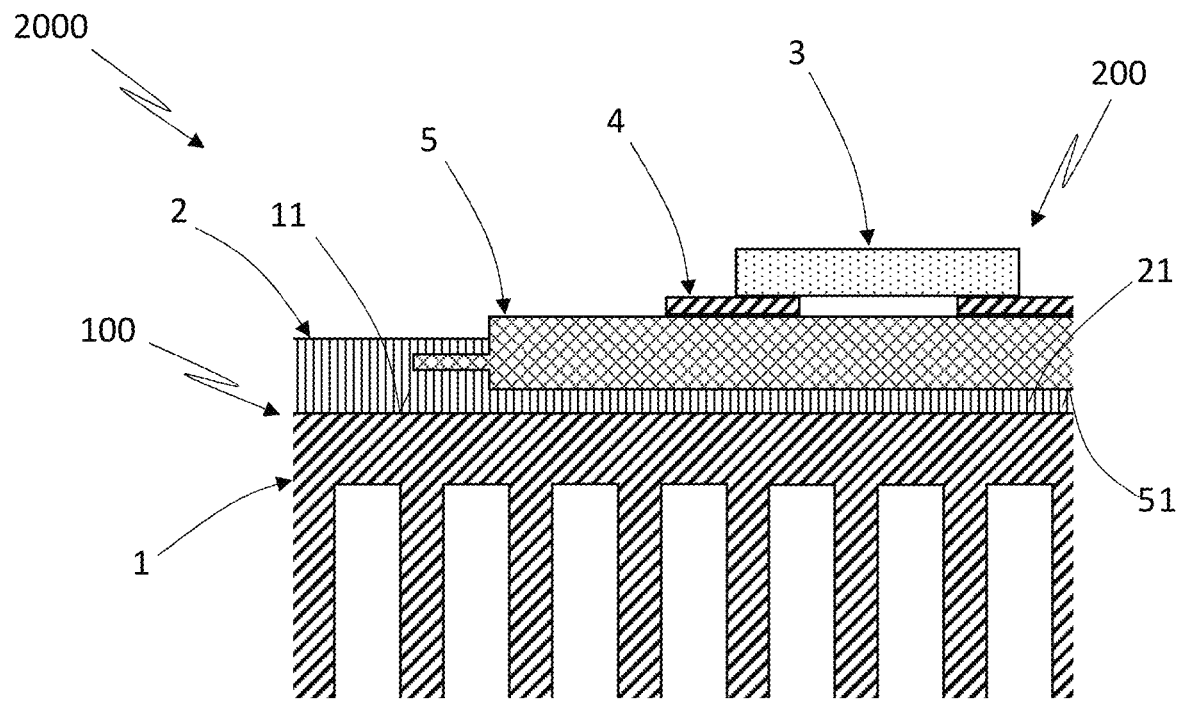
FIG. 4a shows an example.

FIG. 4a shows a detail of a fourth example of a unit 2000 according to the invention, including the support assembly 100 and the electronic component 200, which includes the electronic part 3, in particular a light-emitting diode, and the circuit board 5 together with the strip conductor system 4 for electrically contacting the electronic part 3, the circuit board 5 being connected to the plastic element 2 in a form-fit manner. The circuit board 5 is embedded in the receiving section 21 of the plastic element 2, and a form-fit connection is established by inclusion of the circumferential collar.

Figure 4B:
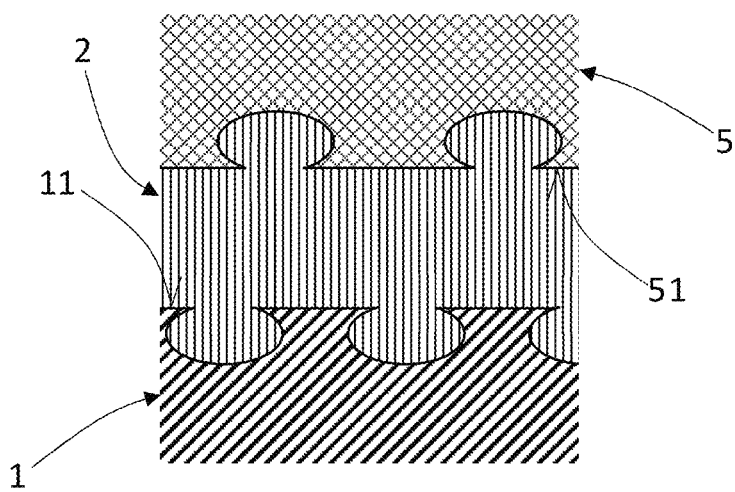

As shown in the associated detailed view in FIG. 4b, the rear side 51 of the circuit board 5 and the heat input side 11 of the heat sink each have microstructured surfaces with undercut microstructures, and the receiving section 21 of the plastic element 2 is thus connected in a form-fit manner in each case.

All of the above examples have the common feature that the plastic element 2 contains a thermosetting plastic with fillers for increasing the thermal conductivity, the degree of filling being such that the plastic element 2 macroscopically forms an electrical insulator. In particular, no percolating clusters of metallic fillers are present which could cause an electrical short circuit across the plastic element 2. During operation of the electronic part 3, the waste heat that occurs enters the receiving section 21 of the plastic element 2, and is subsequently discharged into the metallic heat sink 1 via the heat input side 11. Via the heat discharge side of the heat sink, which is formed here by cooling ribs as an example, the heat is ultimately released to the surroundings, it being possible for the heat discharge side to be acted on by an air stream by means of an additional fan, for example.

The implementation of the invention is not limited to the preferred exemplary embodiment stated above. Rather, a number of variants are conceivable which make use of the described approach, also for basically different types of designs. All features and/or advantages, including structural details and spatial configurations, that arise from the claims, the description, or the drawings may be important to the invention, alone or also in the various combinations.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A support assembly for an electronic component, the support assembly comprising:
   a metallic heat sink; and
   a plastic element with a receiving section to accommodate the electronic component, the plastic element being connected to the heat sink in a form-fit manner, the receiving section of the plastic element covering a heat input side of the heat sink, and the plastic element comprising a thermosetting plastic with fillers to increase a thermal conductivity,
   wherein the thermosetting plastic with fillers is injection molded or hot pressed directly on the heat sink, such that the receiving section of the plastic element accommodates the electronic component without a circuit board.

2. The support assembly according to claim 1, wherein the plastic element has an electrical insulation resistance of at least $10^7$ Ω and/or an isotropic thermal conductivity of at least 1 W/mK or at least 10 W/mK.

3. The support assembly according to claim 1, wherein the heat input side of the heat sink has a microstructured surface with undercut microstructures, and the receiving section of the plastic element is connected in a form-fit manner in the microstructures.

4. The support assembly according to claim 1, wherein the receiving section of the plastic element forms a cover for the heat input side of the heat sink and has a thickness in the range of 0.1 millimeter to 1 millimeter.

5. The support assembly according to claim 1, wherein the plastic element has a retaining section that is adapted for external attachment of the support assembly.

6. A unit comprising:
   at least one support assembly according to claim 1;
   an electronic component including at least one electronic part; and
   a strip conductor system for electrically contacting the at least one electronic part, the at least one electronic part and the strip conductor system being arranged on the receiving section of the plastic element.

7. A light module for a motor vehicle lighting device, comprising a unit according to claim 6, wherein the at least one electronic part is a light-emitting diode.

8. A unit comprising:
at least one support assembly comprising a metallic heat sink and a plastic element with a receiving section to accommodate the electronic component, the plastic element being connected to the heat sink in a form-fit manner, the receiving section of the plastic element covering a heat input side of the heat sink, and the plastic element comprising a thermosetting plastic with fillers to increase a thermal conductivity;
an electronic component having at least one electronic part; and
a circuit board with a strip conductor system to electrically contact the at least one electronic part, the at least one electronic part being arranged on the circuit board, and the circuit board being connected to the plastic element in a form-fit manner.

9. The unit according to claim 8, wherein a rear side of the circuit board has a microstructured surface with undercut microstructures, and the receiving section of the plastic element is connected in a form-fit manner in the microstructures.

10. The unit according to claim 8, wherein the at least one electronic part is a light-emitting diode.

11. The unit according to claim 8, wherein the receiving section of the plastic element is disposed between the circuit board and the heat sink.

12. A method for manufacturing a unit that includes a metallic heat sink, a plastic element with a receiving section to accommodate an electronic component, the plastic element being connected to the heat sink in a form-fit manner, the receiving section of the plastic element covering a heat input side of the heat sink, and the plastic element comprising a thermosetting plastic with fillers to increase a thermal conductivity, the unit further including an electronic component including at least one electronic part, and a strip conductor system for electrically contacting the at least one electronic part, the at least one electronic part and the strip conductor system being arranged on the receiving section of the plastic element, the method comprising:
providing the metallic heat sink with the heat input side of the heat sink being provided with a microstructured surface with undercut microstructures;
injection molding or hot pressing of a compound containing the thermosetting plastic with fillers for increasing the thermal conductivity to form the plastic element in a form-fit connection to the heat sink, the heat input side of the heat sink being covered by the receiving section of the plastic element;
applying the strip conductor system to the receiving section of the plastic element via a molded interconnect device (MID) process, and
applying the at least one electronic part to the receiving section of the plastic element to establish the electrical contact via the strip conductor system.

13. The method according to claim 12, wherein, to establish a form-fit connection to the plastic element, the heat sink is provided with boreholes, blind holes, or protrusions.

14. A method for manufacturing a unit that includes a metallic heat sink, a plastic element with a receiving section to accommodate an electronic component, the plastic element being connected to the heat sink in a form-fit manner, the receiving section of the plastic element covering a heat input side of the heat sink, and the plastic element comprising a thermosetting plastic with fillers to increase a thermal conductivity, the unit further including an electronic component having at least one electronic part and a circuit board with a strip conductor system to electrically contact the at least one electronic part, the at least one electronic part being arranged on the circuit board, and the circuit board being connected to the plastic element in a form-fit manner, the method comprising:
providing the metallic heat sink, with the heat input side of the heat sink being provided with a microstructured surface, with undercut microstructures;
providing the circuit board together with the strip conductor system, with a rear side of the circuit board being provided with a microstructured surface, with undercut microstructures;
injection molding a compound containing a thermosetting plastic with fillers for increasing the thermal conductivity to form the plastic element in a form-fit connection to the heat sink and to the circuit board, the heat input side of the heat sink and the rear side of the circuit board being covered by the receiving section of the plastic element; and
applying the at least one electronic part to the circuit board to establish the electrical contact via the strip conductor system.

* * * * *